(12) United States Patent
Makino et al.

(10) Patent No.: US 7,652,248 B2
(45) Date of Patent: Jan. 26, 2010

(54) INSPECTION APPARATUS AND INSPECTION METHOD

(75) Inventors: Hiroshi Makino, Kokubunji (JP); Kenji Tanimoto, Hitachinaka (JP); Zhaohui Cheng, Tokyo (JP); Hikaru Koyama, Kodaira (JP)

(73) Assignee: Hitachi High-Technologies Corporation, Tokyo (JP)

( * ) Notice: Subject to any disclaimer, the term of this patent is extended or adjusted under 35 U.S.C. 154(b) by 343 days.

(21) Appl. No.: 11/692,263

(22) Filed: Mar. 28, 2007

(65) Prior Publication Data

US 2007/0228276 A1 Oct. 4, 2007

(30) Foreign Application Priority Data

Mar. 30, 2006 (JP) .............................. 2006-092771

(51) Int. Cl.
*G01N 23/00* (2006.01)
*G21K 7/00* (2006.01)

(52) U.S. Cl. ...................................... 250/307; 250/310
(58) Field of Classification Search ................. 250/307, 250/310
See application file for complete search history.

(56) References Cited

U.S. PATENT DOCUMENTS

| | | | | |
|---|---|---|---|---|
| 5,962,961 A | * | 10/1999 | Sakai et al. | 313/336 |
| 6,038,018 A | * | 3/2000 | Yamazaki et al. | 356/237.1 |
| 6,172,363 B1 | * | 1/2001 | Shinada et al. | 850/9 |
| 6,252,412 B1 | * | 6/2001 | Talbot et al. | 324/750 |
| 6,310,341 B1 | * | 10/2001 | Todokoro et al. | 250/305 |
| 6,329,826 B1 | * | 12/2001 | Shinada et al. | 324/751 |
| 6,509,750 B1 | * | 1/2003 | Talbot et al. | 324/750 |
| 6,538,249 B1 | * | 3/2003 | Yoshida et al. | 850/9 |
| 6,635,873 B1 | * | 10/2003 | Takane et al. | 850/9 |
| 6,703,850 B2 | * | 3/2004 | Nozoe et al. | 324/751 |
| 7,105,815 B2 | * | 9/2006 | Obara et al. | 250/310 |
| 7,442,923 B2 | * | 10/2008 | Todokoro et al. | 250/307 |
| 7,507,959 B2 | * | 3/2009 | Bertsche et al. | 250/306 |

FOREIGN PATENT DOCUMENTS

JP 11-121561 4/1999

* cited by examiner

*Primary Examiner*—David A Vanore
(74) *Attorney, Agent, or Firm*—Antonelli, Terry, Stout & Kraus, LLP.

(57) ABSTRACT

When performing an inspection using a charge control function in a SEM wafer inspection apparatus, acceleration voltage, control voltage and deceleration voltage are changed in conjunction so that incident energy determined by "acceleration voltage–deceleration voltage" and bias voltage determined by "deceleration voltage–control voltage" do not change. By this means, charge of a wafer can be controlled, while restraining electrostatic lens effect generated near a control electrode. As a result, an inspection using a charge control function at low incident energy and in a wide viewing field can be performed, and a highly sensitive inspection of semiconductor patterns subject to damages due to electron beam irradiation can be realized. Acceleration voltage, control voltage and deceleration voltage are changed in conjunction so that incident energy determined by "acceleration voltage–deceleration voltage" and bias voltage determined by "deceleration voltage–control voltage" do not change.

5 Claims, 11 Drawing Sheets

JUST AFTER ELECTRON
BEAM IRRADIATION

STABLE STATE

JUST AFTER ELECTRON BEAM IRRADIATION

STABLE STATE

FIG. 2B

JUST AFTER ELECTRON BEAM IRRADIATION

STABLE STATE

INSPECTION APPARATUS AND INSPECTION METHOD

CROSS-REFERENCE TO RELATED APPLICATION

The present application claims priority from Japanese Patent Application No. JP 2006-092771 filed on Mar. 30, 2006, the content of which is hereby incorporated by reference into this application.

TECHNICAL FIELD OF THE INVENTION

The embodiment relates to an electron beam inspection apparatus and an inspection method for inspecting fine circuit patterns of a semiconductor device, liquid crystal or the like and extracting electric defects such as conduction/non-conduction defects and shape defects such as foreign matters, scratches and others in the course of the manufacture thereof.

BACKGROUND OF THE INVENTION

In the manufacturing processes of semiconductor devices, the quality of processes including lithography process, etching process, ion implantation process and the like has great influences upon the yield of the semiconductor devices. Therefore, it is important to detect occurrences of defects and the types thereof at an early stage and feed them back to manufacturing conditions, thereby improving the yield.

In order to inspect circuit patterns formed on a semiconductor wafer in the course of their manufacture, an inspection apparatus in which a scanning electron microscopy is applied (hereinafter, referred to as SEM wafer inspection apparatus) has been employed. The objects to be inspected by this inspection apparatus range widely such as conduction/non-conduction defects, attachment of foreign matters, shape defects of patterns and others.

The SEM wafer inspection apparatus extracts conduction/non-conduction defects by the use of voltage contrasts generated by charging a wafer surface positively or negatively. Herein, the inspection for non-opening defects where a remaining film of an insulator exists at the bottom of a contact hole is taken as an example of the inspection using the voltage contrasts. In the non-opening portion, the remaining film at the bottom of a hole is charged when electron beam is irradiated, and accordingly, a field distribution different from that in the opening portion is formed on the pattern surface. As a result, the number of secondary electrons detected in the opening portion differs from that in the non-opening portion, and these differences are observed as contrasts in an image. In other words, only the defective portions can be detected by comparing the brightness of the contact holes.

In the inspection using the voltage contrasts, it is extremely important to control the charge of the wafer surface. As the method for charging the wafer surface, there are the method using the secondary electron emission efficiency and the method using a control electrode disposed just above a wafer.

In the method using the secondary electron emission efficiency, the polarities of charge are determined by the energy of electrons that enter the wafer and the material of an inspection object. That is, when the secondary electron emission efficiency is 1 or higher, the wafer is charged into a positive polarity, and when it is 1 or lower, the wafer is charged into a negative polarity. In this method, since the charge of the wafer continues until the secondary electron emission efficiency becomes nearly 1, in order to control the charge potential, the incident energy has to be adjusted by the material of patterns.

Figure 2A:
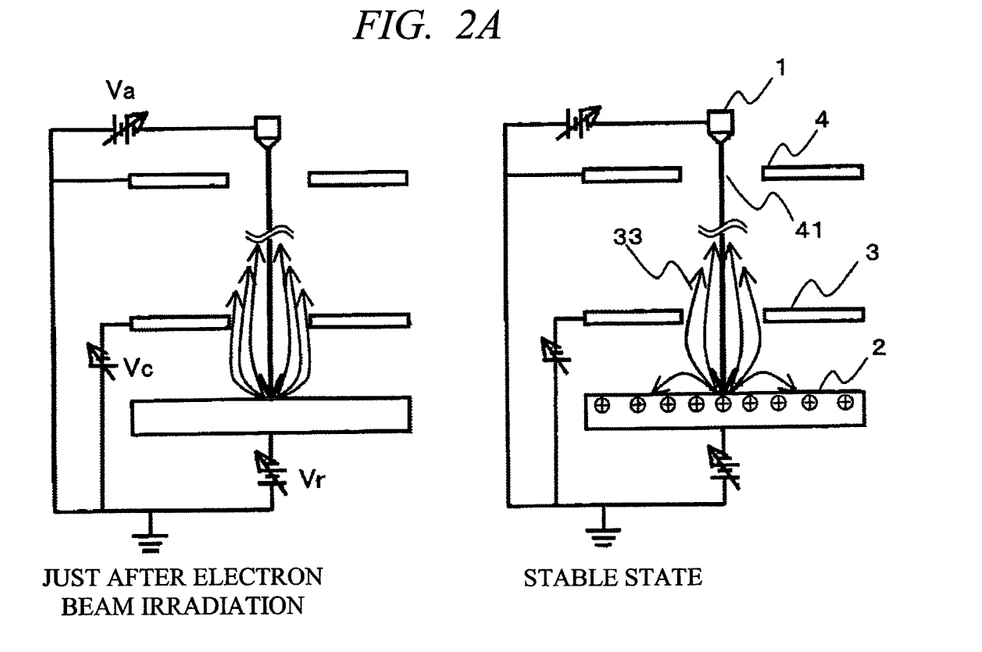
FIG. 2A is a diagram of the charge control principle.
Figure 2B:
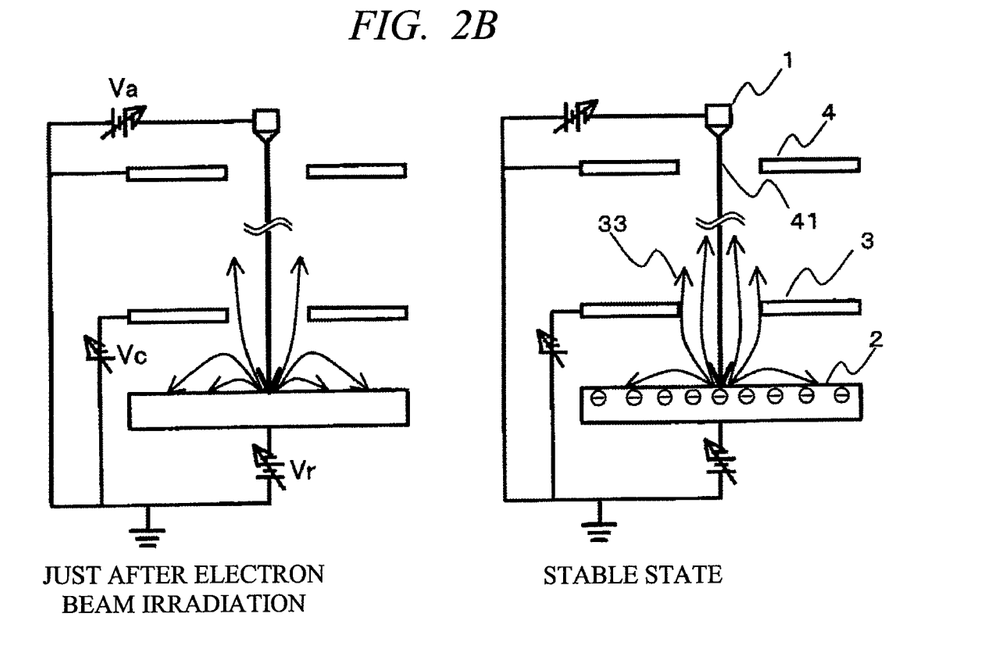
FIG. 2B is a diagram of the charge control principle.

The method using a control electrode will be described with reference to FIG. 2. In both FIG. 2A and FIG. 2B, only minimum required structural components for describing this method are shown. Acceleration voltage (Va) is applied to an electron source 1, deceleration voltage (Vr) is applied to a wafer 2, and control voltage (Vc) is applied to a control electrode 3, respectively. The electron beam emitted from the electron source 1 is accelerated to the acceleration voltage (Va) and enters the wafer 2 at the energy equivalent to "acceleration voltage (Va)–deceleration voltage (Vr)". It is assumed here that the energy with which the electron beam enters the wafer 2 at this moment is under the condition that the secondary electron emission efficiency is 1 or higher. The charge of the surface of the wafer 2 is determined by "bias voltage=deceleration voltage (Vr)–control voltage (Vc)", and FIG. 2A shows the case where the surface of the wafer 2 is charged positively and the condition of the bias voltage>0 and FIG. 2B shows the case where the surface of the wafer 2 is charged negatively and the condition of the bias voltage<0. In the case of FIG. 2A, since the secondary electron emission efficiency is 1 or higher just after the electron beam is irradiated to the wafer 2, the surface of the wafer 2 is charged positively. Then, when the bias voltage and the charge of the surface of the wafer 2 become nearly equal to each other, the number of secondary electrons 33 passing through the control electrode 3 and the number of primary electrons 41 that enter the wafer 2 become nearly equal to each other, and the charge of the surface of the wafer 2 becomes stable. In the case of FIG. 2B, just after the electron beam is irradiated to the wafer 2, many of the secondary electrons 33 emitted from the wafer 2 are returned to the wafer 2 due to the influence of the bias voltage, and the surface of the wafer 2 is charged negatively. Then, when the bias voltage and the charge of the surface of the wafer 2 become nearly equal to each other, the number of secondary electrons 33 passing through the control electrode 3 and the number of primary electrons 41 that enter the wafer 2 become nearly equal to each other, and the charge of the surface of the wafer 2 becomes stable. The advantage of this method lies in that the charge of the wafer surface can be controlled by the bias voltage if the incident energy of the electron beam is under the condition of the secondary electron emission efficiency>1. More specifically, it is possible to control the charge of almost all insulators by an arbitrary incident energy of several 100 to 1000 eV (refer to, for example, Japanese Patent Application Laid-Open Publication No. 11-121561 (Patent Document 1)).

SUMMARY OF THE INVENTION

At present, various types of insulating films are used in circuit patterns of semiconductors. Among them, $SiO_2$ and $Si_3N_4$ have small damages due to electron beam irradiation, and insulating films are not damaged even in an inspection using the SEM wafer inspection apparatus. However, since many of resist materials used in exposure process and low-k materials used in Cu wiring process are apt to be damaged by electron beam irradiation, it is necessary to lower the incident energy of electron beam to several 100 eV in inspections. However, since control voltage almost equal to the deceleration voltage applied to the wafer is applied to the electrode in the conventional charge control using the control electrode, the influence of an electrostatic lens which occurs in the vicinity of the control electrode is inevitable. As this control voltage becomes higher, the action of the electrostatic lens becomes stronger, which leads to such problems as the deterioration of resolution, the decreased uniformity of resolution in viewing field, the narrowed scan area of electron beam (that is, narrowed viewing field) and others.

Figure 3A:
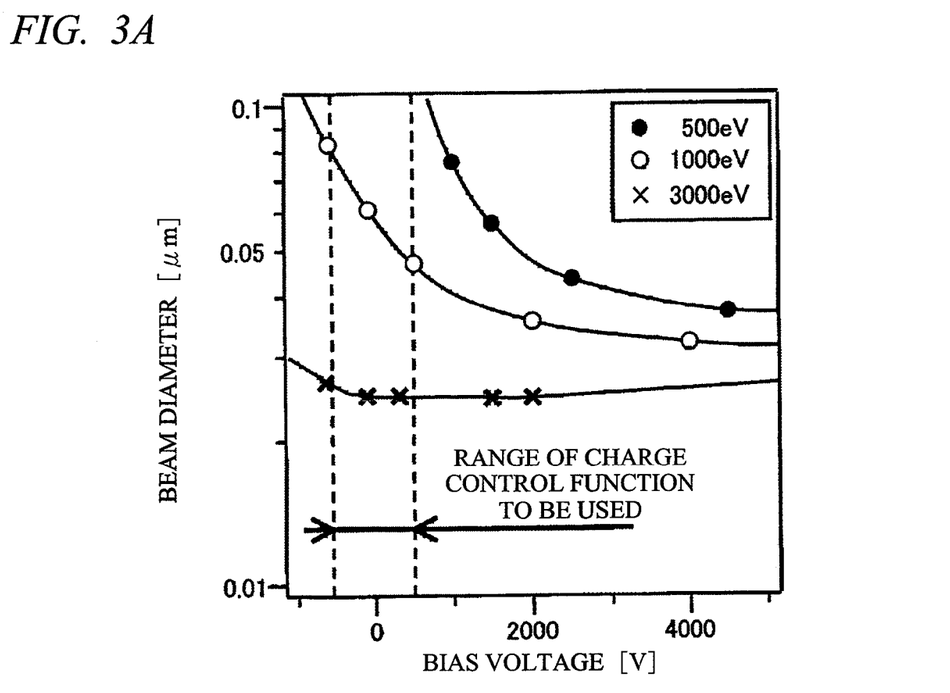
FIG. 3A is a diagram of the relation between bias voltage and optical characteristics.
Figure 3B:
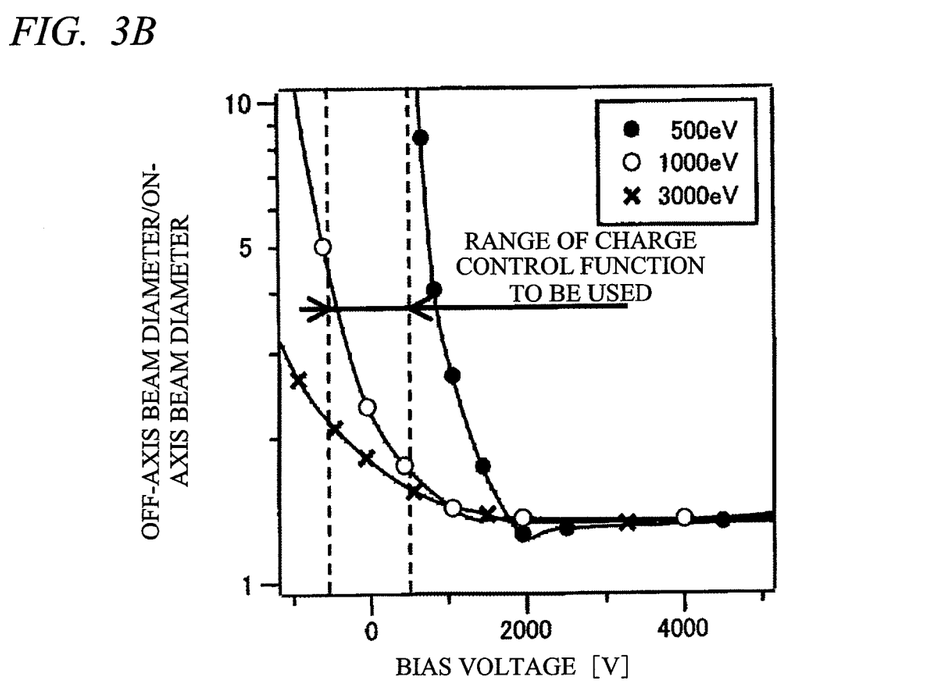
FIG. 3B is a diagram of the relation between bias voltage and optical characteristics.

The results of simulations for the deterioration of resolution and the uniformity of resolution in viewing field are shown in FIG. 3. FIG. 3A shows the relation between bias voltage and beam diameter, and it indicates that the larger the beam diameter becomes, the more the resolution is deteriorated. FIG. 3B shows the relation between bias voltage and off-axis beam diameter/on-axis beam diameter, and the off-axis beam diameter is the result of the calculation of the beam diameter in the case where electron beam is deflected by 200 μm on a wafer. Accordingly, it indicates that, as the off-axis beam diameter/on-axis beam diameter becomes closer to 1, the resolution in viewing field becomes uniform. Further, both FIG. 3A and FIG. 3B are the results of simulations in the case where the acceleration voltage=10000[V], and if the incident energy is 500 [eV] for example, the deceleration voltage=−9500 [V], and if the bias voltage is 0 [V], the control voltage=−9500 [V]. Herein, the bias voltage is defined by "deceleration voltage−control voltage" mentioned above, and the bias voltage=±500 [V] is set as the range of use of the charge control function in FIG. 3.

According to the results in FIG. 3A, under the condition where the bias voltage is 2000 [V] or higher, the beam diameter does not depend upon the bias voltage, but when the bias voltage is below 2000 [V], the beam diameter becomes larger as the bias voltage becomes smaller. Further, as the incident energy becomes lower, the increase of the beam diameter relative to the changes of the bias voltage becomes more conspicuous. The same tendencies are seen also in FIG. 3B, that is, as the incident energy becomes lower, the off-axis beam diameter/on-axis beam diameter relative to the changes of the bias voltage becomes larger. According to these simulation results, when the charge control is carried out by use of the control electrode, a highly sensitive inspection cannot be performed under the condition where the incident energy is below 1000 [eV] due to the deterioration of resolution and the decrease of uniformity of resolution in viewing field.

Figure 4:
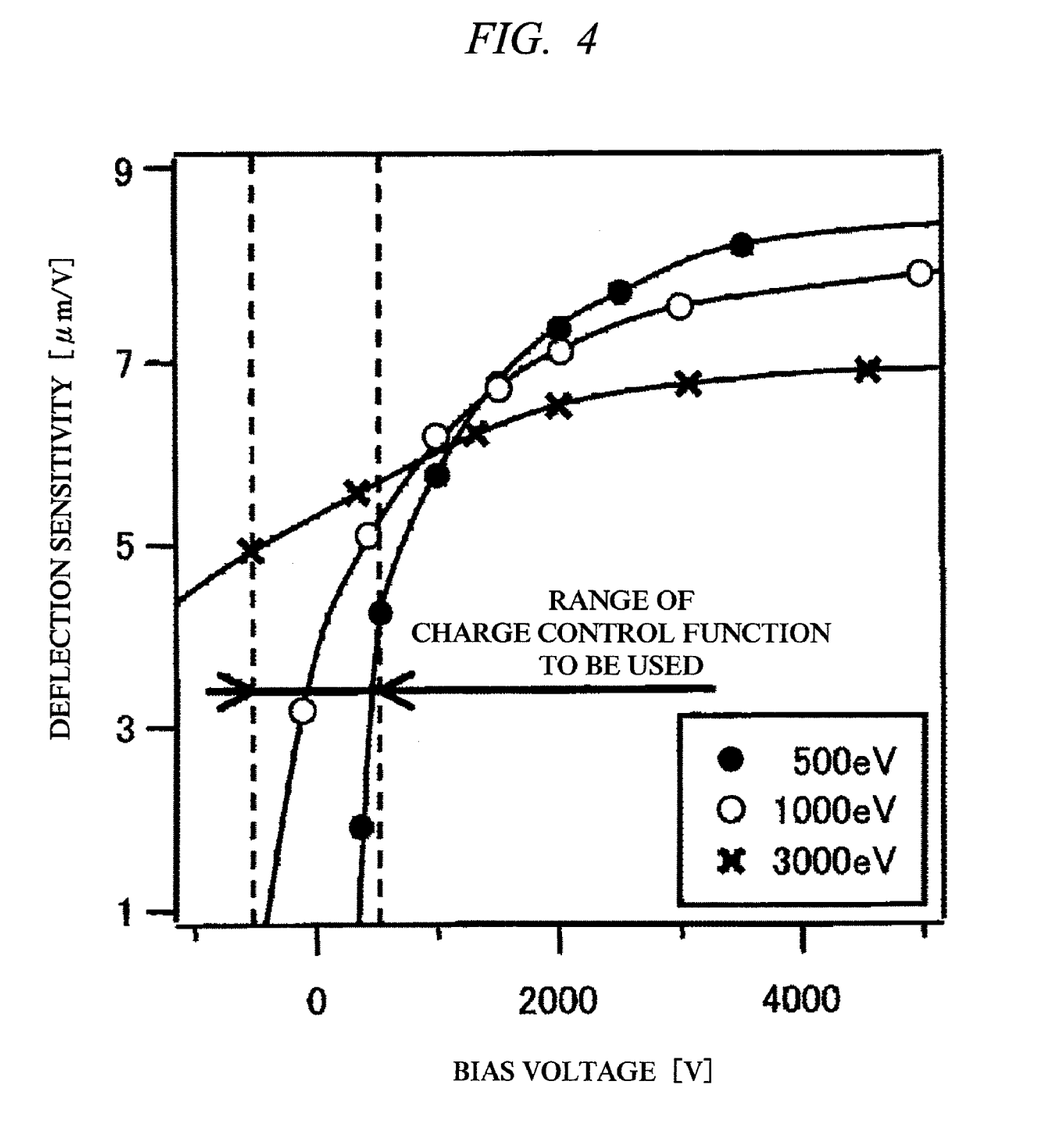
FIG. 4 is a diagram of the relation between bias voltage and deflection sensitivity.

Further, the results of simulations for the scan area of electron beam performed using the same model as the above are shown in FIG. 4. FIG. 4 shows the relation between the deflection sensitivity of electron beam and the bias voltage, and the deflection sensitivity represents how many μm the electron beam is deflected on the wafer when ±1 [V] is applied to opposing electrodes in the electrostatic deflection method using electrodes. More specifically, it indicates that the larger the deflection sensitivity is, the wider the scan area of electron beam when the same voltage is applied to electrodes is. According to FIG. 4, at the incident energy of 3000 [eV], the deflection sensitivity does not change greatly by the bias voltage, but at the incident energy of 1000 [eV] and 500 [eV], the deflection sensitivity of 7 to 8 [μm/V] at the bias voltage of 3000 [V] becomes the deflection sensitivity of lower than 3 [μm/V] at the bias voltage of 0 [V]. More specifically, it indicates that, in the case where an inspection is carried out with the incident energy of lower than 1000 [eV], the maximum viewing field is reduced to half or less in comparison with the case where the charge control is not carried out, and the inspection speed becomes slower accordingly.

From these results, in the charge control using the control electrode, the charge of the wafer can be controlled at arbitrary conditions if the secondary electron emission efficiency is 1 or higher (several 100 to 1000 eV), but the use thereof is limited to the case of the incident energy range of about 1000 eV due to the occurrence of problems such as the deterioration of resolution, decreased uniformity of resolution in viewing field, and narrowed viewing field. That is, at present, there is no effective charge control method to the wafer whose insulating film is formed of resist or low-k materials.

In order to solve the above problem, in an inspection apparatus and an inspection method according to the present invention, the acceleration voltage, the control voltage and the deceleration voltage are controlled in conjunction so that both the incident energy determined by "acceleration voltage−deceleration voltage" and the bias voltage determined by "deceleration voltage−control voltage" become constant.

By using the present invention, it is possible to attain the charge control at the incident energy of several 100 [eV] and uniform and preferable resolution in a wide viewing field. Further, since a wide viewing field can be obtained, the inspection speed can be increased. Thus, according to the present invention, an inspection with controlled charge can be performed even to wafers made of resist and low-k materials.

DESCRIPTIONS OF THE PREFERRED EMBODIMENTS

In the embodiment, attention is paid to the fact that the deterioration of resolution by the low incident energy of less than 1 keV in the charge control using a control electrode is caused by blurred beam due to the aberration of electrostatic lens which occurs in the vicinity of the control electrode. Then, in order to reduce the aberration of the electrostatic lens, the bias voltage to control the charge is fixed, and the acceleration voltage, the control voltage and the deceleration voltage are controlled in conjunction, and the charge is controlled with low control voltage. By this means, the deterioration of resolution can be greatly reduced.

Figure 5:
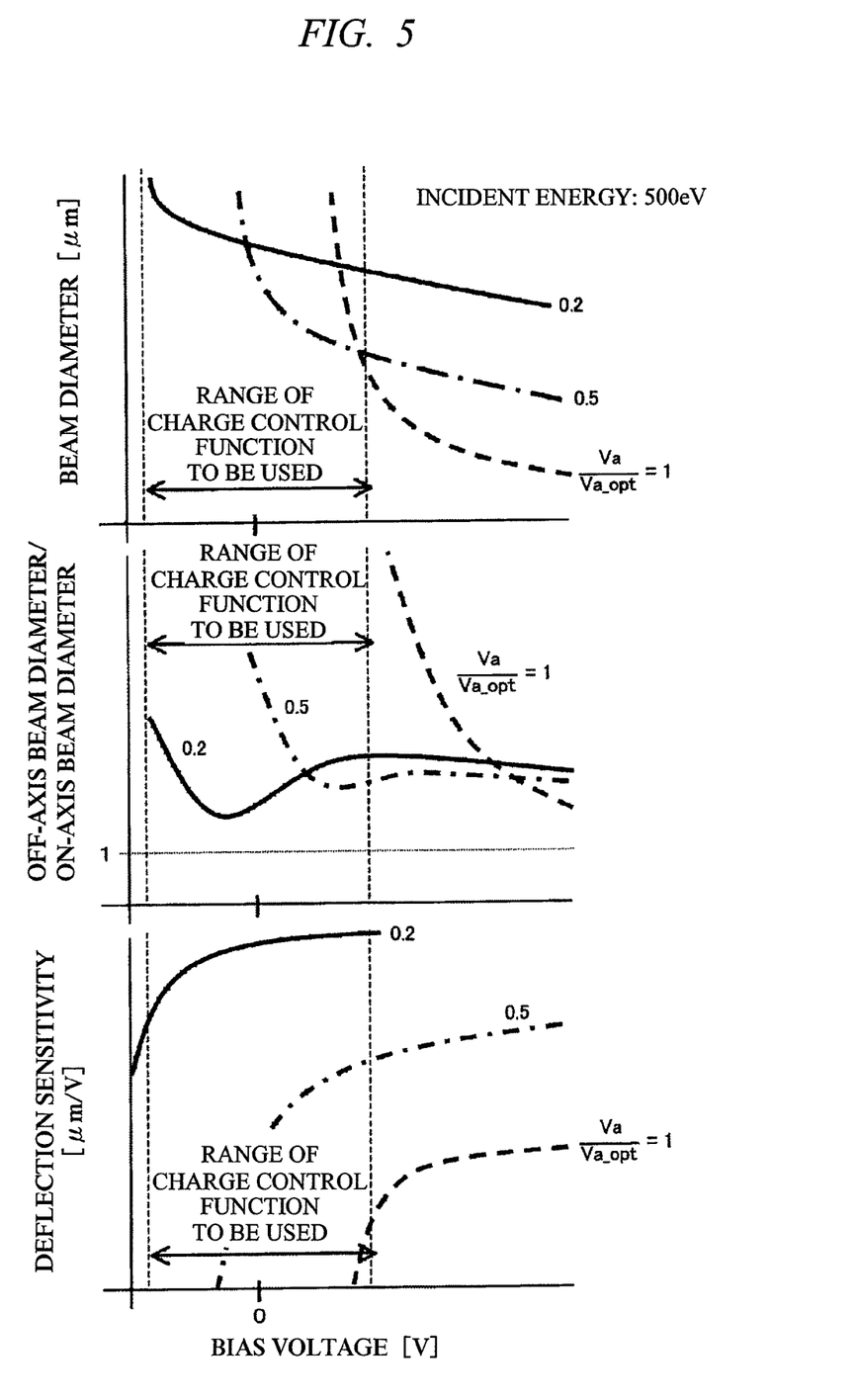
FIG. 5 is a diagram of the relation between bias voltage and optical characteristics under an application of the embodiment.

FIG. 5 is a diagram for describing optical characteristics of the embodiment, and it schematically shows the characteristics of the resolution (beam diameter) to the bias voltage, the uniformity (off-axis beam diameter/on-axis beam diameter) of resolution in viewing field to the bias voltage, and the effective viewing field (deflection sensitivity) to the bias voltage. Herein, the optical characteristics in the case where Va/Va_opt=0.2, 0.5, 1.0 are schematically shown, respectively, and Va_opt means the acceleration voltage which can realize the highest resolution in the optical system to embody the embodiment and Va/Va_opt=0.5 means the acceleration voltage half of Va_opt (Va=0.5Va_opt). Further, the range of the bias voltage where the charge control function is effective differs depending on the structure of a ground electrode and a control electrode mentioned later, and it may be ± several 10V or ± several 1000V in some cases. The range of this effective bias voltage will be described in the section of the correction method of barrier potential and bias voltage to be described later.

(Resolution (Beam Diameter))

Herein, the beam diameter is the size of a beam at the center of viewing field of a scan image, and the smaller the beam diameter, the higher the resolution of an image can be realized. Normally, the optical system is operated under the condition of Va/Va_opt=1.0. However, in the case where the charge is controlled by use of a control electrode, the beam diameter increases rapidly and the image quality is deteriorated due to the influence of aberration of the electrostatic lens described above. In the embodiment, in order to restrain this aberration of the electrostatic lens, the operation condition of the acceleration voltage is set to Va/Va_opt<1.0 (for example, 0.5, 0.2), and the acceleration voltage, the control voltage and the deceleration voltage are controlled in conjunction so that the minimum beam diameter within the range of bias voltage effective for the charge control can be realized.

(Uniformity of Resolution (Off-Axis Beam Diameter/On-Axis Beam Diameter))

The off-axis beam diameter mentioned here means the size of a beam at the end of a scan image, and the closer to 1 the off-axis beam diameter/on-axis beam diameter is, the more uniform the resolution in the scan area is. Also in this case, in an ordinary optical system, the optical system is operated under the condition of Va/Va_opt=1.0. However, in the embodiment, by setting the operation condition of the acceleration voltage to Va/Va_opt<1.0 (for example, 0.5, 0.2) in the same manner as that in the previous resolution, the resolution in the scan area can be made more uniform.

(Effective Viewing Field (Deflection Sensitivity))

The deflection sensitivity mentioned here means the sensitivity of a deflector that scans electron beam, and the higher this deflection sensitivity is and the closer to 1 the off-axis beam diameter/on-axis beam diameter is, the wider the effective viewing field becomes. Similar to the case described above, when the embodiment is applied, the deflection sensitivity remarkably increases by the synergy effect of the reduction of the electrostatic lens effect and the decrease of acceleration voltage by the control electrode, and accordingly a great improvement of the inspection speed can be realized.

By carrying out the control described above, the charge can be controlled with a low incident energy of less than 1 keV, and a high resolution image can be obtained. Further, the improvement of inspection speed owing to the expansion of the effective viewing field can be achieved. Hereinafter, embodiments according to the embodiment will be described in details with reference to the attached drawings.

First Embodiment

In the present embodiment, the structure of an inspection apparatus and the inspection method thereof will be described, in which the acceleration voltage, the control voltage and the deceleration voltage are controlled in conjunction so that both the incident energy determined by "acceleration voltage−deceleration voltage" and the bias voltage determined by "deceleration voltage−control voltage" become constant.

(Structure of Apparatus)

Figure 1:
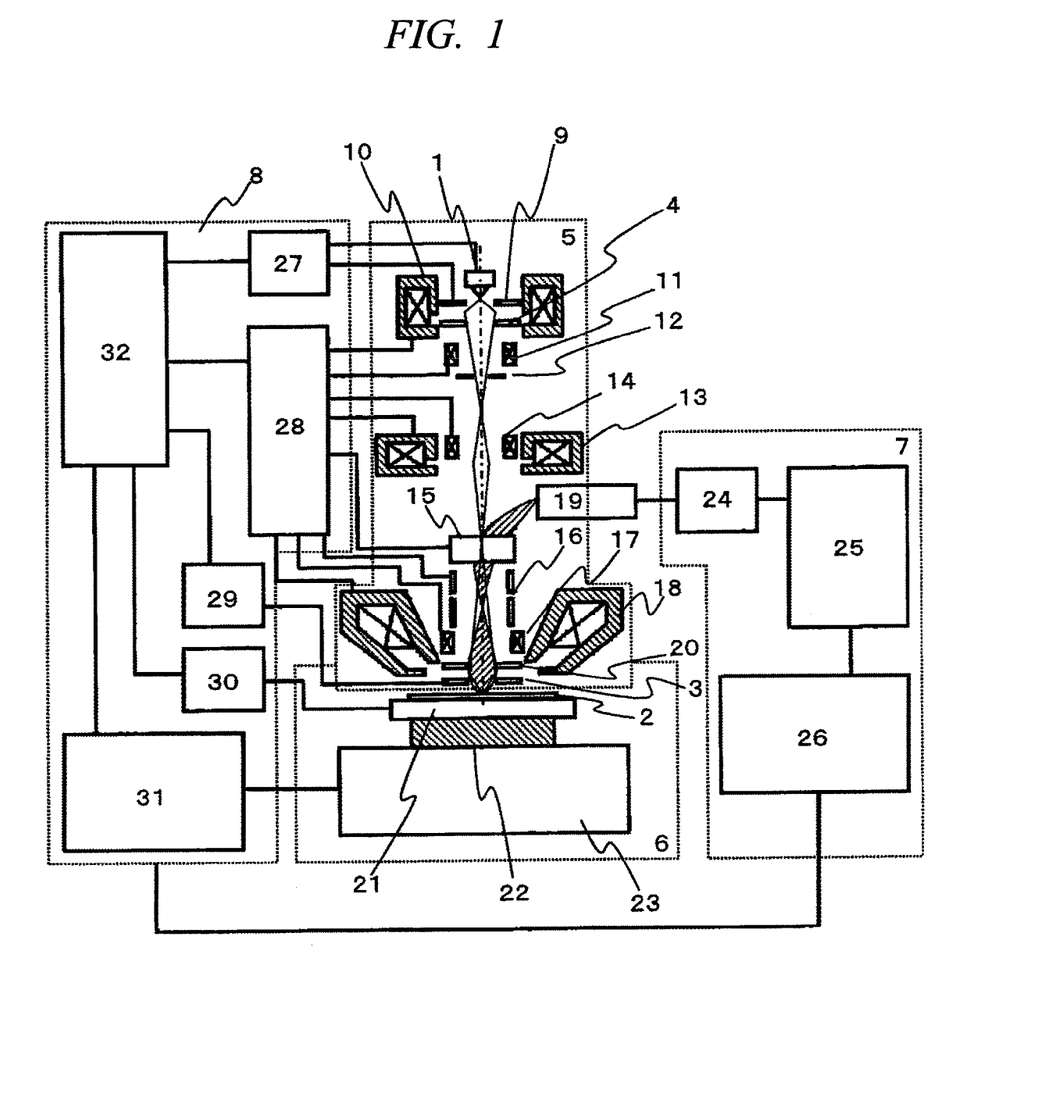
FIG. 1 is a schematic view of the inside structure of an apparatus according to one of preferred embodiment.

FIG. 1 shows structural components for describing an inspection apparatus according to the embodiment, and the inspection apparatus is configured of an electron optical system 5, a stage unit 6, an image processing unit 7, and a control unit 8. The electron optical system 5 includes an electron source 1, an extraction electrode 9, an anode electrode 4, a condenser lens a10, an alignment coil a11, a limiting aperture 12, a condenser lens b13, an alignment coil b14, an ExB deflector 15, a deflector 16, an alignment coil c17, an objective lens 18, a detector 19, a ground electrode 20, and a control electrode 3. The stage unit 6 includes a wafer 2, a wafer holder 21, an insulation material 22, and a stage 23. Herein, it is assumed that the electron optical system 5 and the stage unit 6 are always vacuumed by a vacuum exhaust system though not illustrated in FIG. 1. The image processing unit 7 includes an image forming unit 24, an image processing unit 25, and an image display unit 26. Further, the control unit 8 includes an electron gun power source 27, an electron optical system control power source 28, a control power source, a deceleration power source, a stage control unit 31, and an electron optical system control unit 32. The image display unit 26 mentioned here not only displays images but also has a function as a user interface of an information processor (personal computer or the like). In other words, the image display unit 26 has a function to store information that an operator inputs and collectively control the respective units on the basis of the stored information.

The electron gun power source 27 applies the acceleration voltage to the electron source 1 and the extraction voltage to the extraction electrode 9, thereby forming a potential difference between the electron source 1 and the extraction electrode. By doing so, the electron beam is emitted from the electron source 1 and accelerated to the energy of the acceleration voltage in the vicinity of the anode electrode 4 serving as the ground potential. The electron beam is subjected to the convergence effect by the influence of an electromagnetic field generated by the condenser lens a10, and the take-in angle of the electron beam is limited by the limiting aperture 12. Thereafter, the electron beam is subjected to the convergence effect in the electromagnetic field of the condenser lens b13 and forms a crossover in the vicinity of the ExB, and then it is subjected to the convergence effect in the electromagnetic field of the objective lens 18 and forms a focus on the wafer 2. Note that the control voltage is applied to the control electrode just above the wafer 2, and the deceleration voltage is applied to the wafer 2. Accordingly, the bias voltage determined by "deceleration voltage−control voltage" is always applied to the surface of the wafer 2, and the electron beam enters the wafer 2 with the energy equivalent to "acceleration voltage−deceleration voltage".

The secondary electrons 33 generated from the wafer 2 are accelerated to the energy determined by the deceleration voltage, pass through the objective lens 18, and are bent by the ExB deflector 15 and then detected by the detector 19. In this case, the ExB deflector 15 is formed of an electrostatic deflector and an electromagnetic deflector and is adjusted so that the deflection effect is not given to the electron beams traveling from the electron source 1 toward the wafer 2 and only the secondary electrons 33 traveling from the wafer 2 toward the electron source 1 are deflected.

With regard to the image forming method, the electron beam is deflected by the deflector 16 so that the electron beam scans the wafer 2, and the secondary electrons 33 taken in by the deflector 19 are imaged by the image forming unit 24 as a map of the secondary electron signal amount synchronized with the scan signal. In the image processing unit 25, images of the same patterns in different places in the wafer 2 are compared, and a defective portion is extracted. Then, the coordinate data of the place where the extracted defect occurs and the image of the defective portion are stored as inspection results. The inspection results can be displayed at any time as the defect distribution and the defect image in the wafer 2 by the image display unit 26.

In the embodiment, in the above-described structure, the electron optical system control unit 32 controls the electron gun power source 27, the control voltage power source 29, and the deceleration voltage power source 30 so that the acceleration voltage, the control voltage, and the deceleration voltage work in conjunction, and it also controls the electron optical system control power source 28 so that the electron beam emitted from the electron source 1 always forms a focus on the wafer 2. In concrete, in the case where the bias voltage is set to −100 [V] and the incident energy is set to 500 [eV], when the acceleration voltage is 10 [kV], the deceleration voltage becomes −9.5 [kV] and the control voltage becomes −9.6 [kV], and when the acceleration voltage is 5 [kV], the deceleration voltage becomes −4.5 [kV] and the control voltage becomes −4.6 [kV]. At this time, the excitation of the condenser lens a10, the condenser lens b13, and the objective lens 18 is switched so that the electron beam forms a focus on the wafer 2 under any conditions, and also the orbit of the electron beam is corrected by the alignment coil a11, the alignment coil b14, and the alignment coil c17 in order to prevent the image quality deterioration due to the displacement of the orbit of the electron beam. In the embodiment, the control mentioned above is collectively managed by the image display unit 26, in which the image display unit 26 stores the optimal output values of the respective lenses and the respective alignment coils in the case where the acceleration voltage, the control voltage, and the deceleration voltage are controlled in conjunction as a database, and it also controls the respective power sources via the electron optical system control unit 32.

(Correction Method of Barrier Potential)

Figure 6:
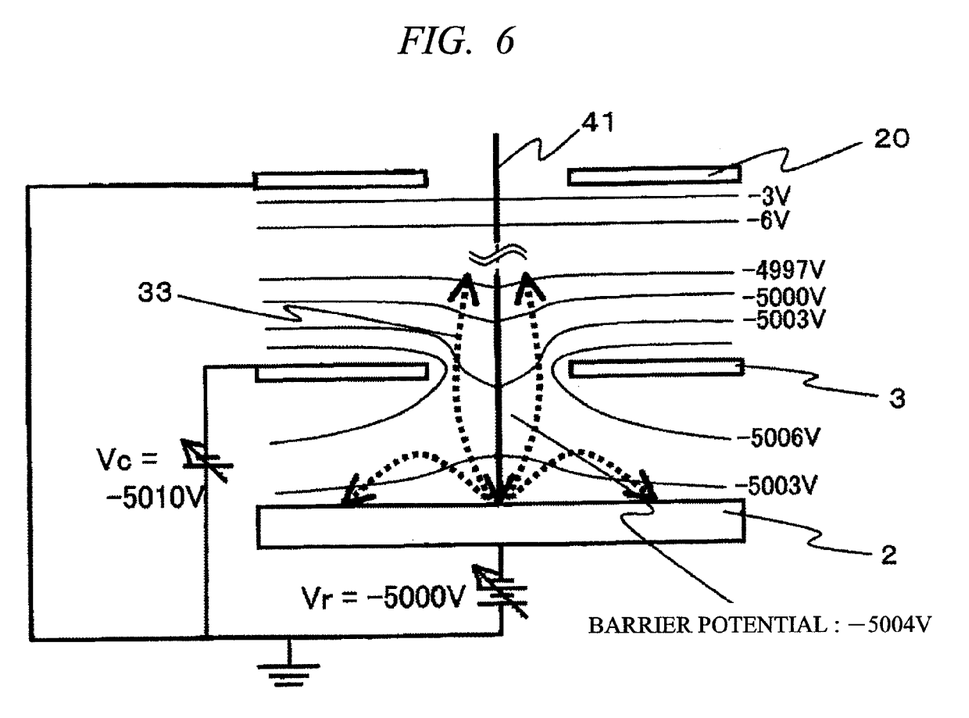
FIG. 6 is a diagram for describing the characteristics of the bias voltage and the barrier potential.

Next, the barrier potential which influences the surface charge in the charge control method according to the embodiment will be described with reference to FIG. 6. FIG. 6 is a diagram schematically showing the vicinity of the wafer 2 of the electron optical system shown in FIG. 1 and is used for describing the difference between the bias voltage and the barrier potential. The deceleration voltage (Vr=−5000V) is applied to the wafer 2, and the control voltage (Vc=−5010V) is applied to the control electrode 3 just above the wafer 2. Further, in order to clarify the relation between the barrier potential and the bias voltage, isoelectric lines are schematically illustrated at every 3V. Note that, since there are numerous isoelectric lines between the control electrode 3 and the ground electrode 20, some of them are omitted therein. In this case, the barrier potential exists on the axis on which the primary electron 41 enters the wafer 2, and it plays the function of an energy filter that transmits high energy components among the secondary electrons generated from the wafer 2 and redistributes low energy components to the wafer 2. In FIG. 6, the barrier potential is −5004V, and the secondary electrons 33 emitted from the wafer of −5000V penetrate through the barrier potential if the energy at the time of emission is about 4 eV or higher, and the secondary electrons 33 emitted from the wafer are redistributed to the wafer 2 if the energy at the time of discharge is less than 4 eV.

Figure 7:
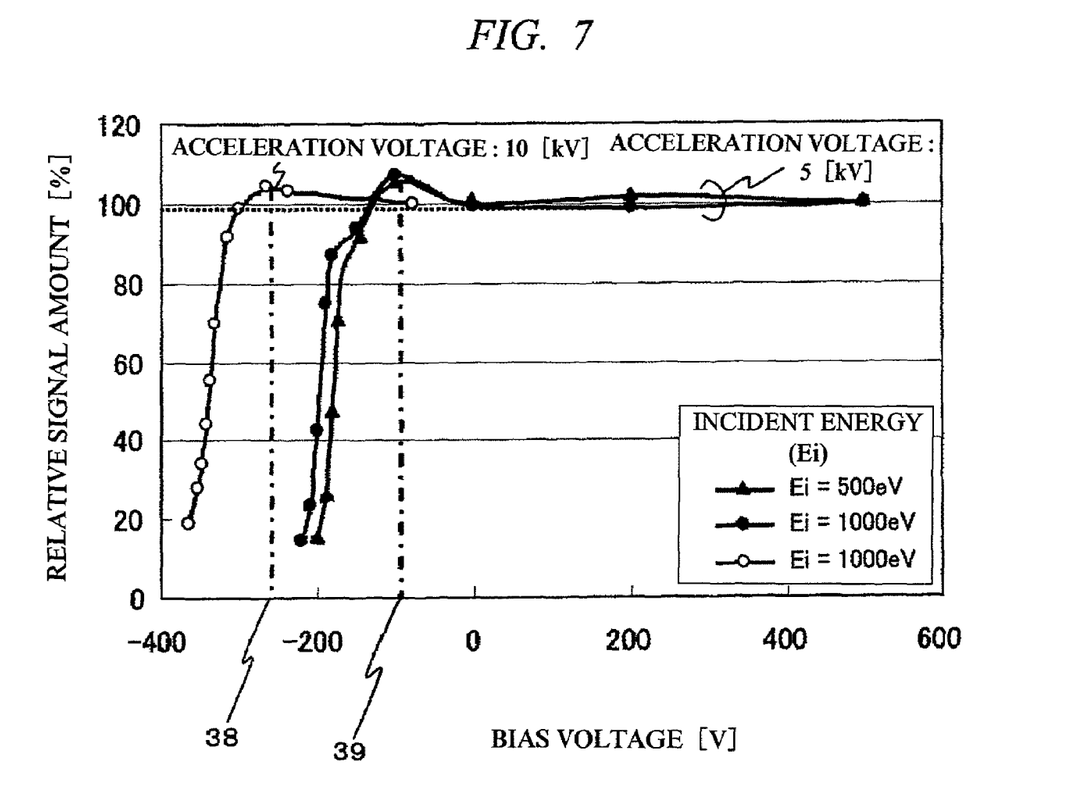
FIG. 7 is a diagram for describing the correction method of barrier potential in the embodiment.

In the embodiment, when the condition of the bias voltage of less than 0V is used, the charge of the surface of the wafer 2 is determined by the barrier potential, and the relation between the bias voltage and the barrier potential changes greatly by the structure in the vicinity of the control electrode 3 and the ground electrode 20. Accordingly, it is necessary to always control the relation between the bias voltage and the barrier potential. FIG. 7 is a diagram showing the relation between the bias voltage and the secondary electron signal amount detected by the detector 19 in the structure according to the embodiment, and the relation between the bias voltage and the barrier potential can be controlled by measuring this relation. Note that, with regard to the relative signal amount on the vertical axis, the signal amount at which the bias voltage is of positive polarity and the signal amount does not depend upon the bias signal is defined as 100%, and signal amounts at respective measurement points are standardized. In this case, the condition of the relative signal amount of 100% is the condition where almost all of the secondary electrons emitted from the wafer 2 are captured by the detector, and it means the condition where there is no barrier potential on the axis.

In FIG. 7, signal amounts at the respective measurements with the bias voltage of ±500V are standardized and displayed as relative signal amounts. The white circle in FIG. 7 represents the change of the relative signal amounts in the case where the bias voltage is changed under the conditions of the acceleration voltage of 10 kV and the incident energy of 1000 eV. Further, the black circle represents the change of the relative signal amounts under the conditions of the acceleration voltage of 5 kV and the incident energy of 1000 eV, and the triangle represents the change of the relative signal amounts under the conditions of the acceleration voltage of 5 kV and the incident energy of 500 eV. The relative signal amount at the acceleration voltage of 10 kV becomes maximum at the bias voltage of −280V and rapidly decreases when the bias voltage shifts to more negative values than that. This is because all the secondary electrons generated from the wafer are taken in by the detector at the bias voltage of −280V, and when the bias voltage shifts to more negative values than that, the barrier potential corresponding to the bias voltage is formed for the first time. On the other hand, in the case of the acceleration voltage of 5 kV, the relative signal amount becomes maximum at the bias voltage of −100V in both the cases of the incident energies of 500 eV and 1000 eV, and when the bias voltage shifts to more negative values than that, the barrier potential is formed and the relative signal amount decreases. With regard to the relation between the bias voltage and the barrier potential, the above-mentioned bias voltage at which the relative signal amount becomes maximum is measured, and the barrier potential can be controlled by the difference between the bias voltage to be applied and the bias voltage at which the relative signal amount becomes maximum. More specifically, by using the method described above, the bias voltage can be adjusted so that an appropriate barrier potential can be formed even when the acceleration voltage is changed. Further, the range of the bias voltage effective for the charge control is almost determined by the bias voltage at which the relative signal amount becomes minimum. For example, in the case where the acceleration voltage is 10 kV, since the relative signal amount becomes minimum at the bias voltage of −380V, the range effective for the charge control is approximately ±380V. Note that, with regard to the range of the bias voltage, any range can be set as long as a range almost equal to the effective range obtained by the procedure described above (±380V in the above-described case) is set, and even when the effective range in the above-described case is set to ±500V, there is no need to review the range effective for the charge control if a problem such as image quality deterioration due to excessive charge or the like does not occur in the charge control using the embodiment.

(Method for Obtaining the Optimal Conditions Using the Control of the Embodiment)

Next, an example of a method for obtaining the optimal inspection conditions in the case where the acceleration voltage, the control voltage and the deceleration voltage are controlled in conjunction as parameters will be described with reference to the attached drawings.

Figure 8A:
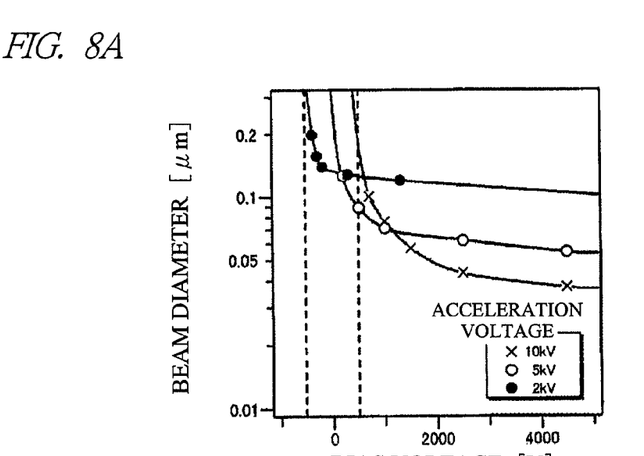
FIG. 8A is a diagram of the relation between bias voltage and optical characteristics under an application of the embodiment.
Figure 8B:
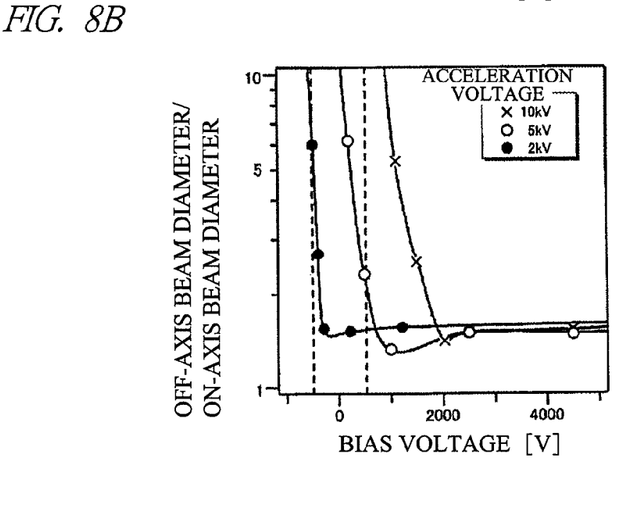
FIG. 8B is a diagram of the relation between bias voltage and optical characteristics under an application of the embodiment.
Figure 8C:
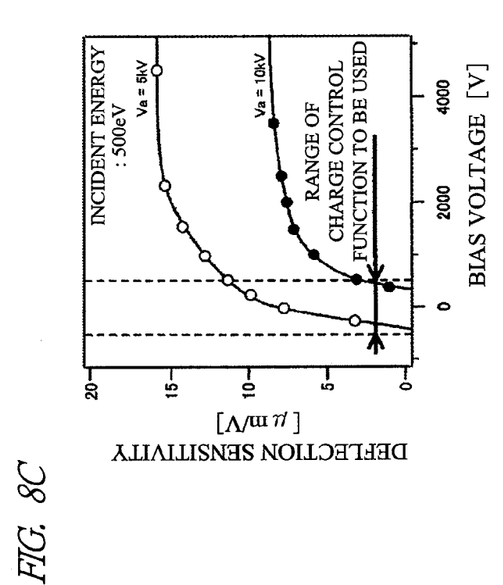
FIG. 8C is a diagram for describing the relation between bias voltage and optical characteristics under an application of the embodiment.

FIG. 8 shows the results of calculations of the bias voltage dependency of optical characteristics in the case where the control of the first embodiment is carried out under the conditions of the acceleration voltages of 10, 5, 2 [kV] and the incident energy of 500 [eV]. Note that, in the calculations of optical characteristics, the acceleration voltage to realize the highest resolution is set to 10 kV, and the case where the embodiment is applied is examined. FIG. 8A shows the relation between the bias voltage and the beam diameter, FIG. 8B shows the relation between the bias voltage and the off-axis beam diameter/on-axis beam diameter, and FIG. 8C shows the relation between the bias voltage and the deflection sensitivity, in which the bias voltage ±500 [V] is set to the use range of the charge control function.

According to FIG. 8A, when the bias voltage is 1000 [V] or higher, the beam diameter becomes smallest under the condition of the acceleration voltage of 10 [kV]. Meanwhile, when the bias voltage is 0 to 1000 [V], the beam diameter becomes smallest under the condition of the acceleration voltage of 5 [kV], and when the bias voltage is less than 0 [V], the beam diameter becomes smallest under the condition of the acceleration voltage of 2 [kV]. The same tendency can be seen also in FIG. 8B, that is, when the bias voltage is 2000 [V] or higher, the off-axis beam diameter/on-axis beam diameter becomes smallest under the condition of the acceleration voltage of 10 [kV], when the bias voltage is 500 to 2000 [V], the off-axis beam diameter/on-axis beam diameter becomes smallest under the condition of the acceleration voltage of 5 [kV], and when the bias voltage is less than 800 [V], the off-axis beam diameter/on-axis beam diameter becomes smallest under the condition of the acceleration voltage of 2 [kV].

By making the graphs of the relations between the bias voltage and the beam diameter and between the bias voltage and the off-axis beam diameter/on-axis beam diameter for the respective incident energies and the respective acceleration voltages as shown in FIG. 8, it is possible to always perform the inspection under the optimal conditions. For example, in the case of the inspection using the charge control function, if the incident energy of 500 [eV] and the bias voltage of 0 [V] are used as conditions, the acceleration voltage at which the beam diameter and the off-axis beam diameter/on-axis beam diameter become smallest is 2 [kV]. By using the conditions, the charge control at the incident energy of 500 [eV] becomes possible, which has been impossible at the acceleration voltage of 10 [kV]. Further, the effect of optimizing the acceleration voltage is shown in FIG. 8C. More specifically, if an inspection with the controlled charge is to be carried out under the condition where the acceleration voltage (Va) is 10 kV, since the deflection sensitivity is only several [μm/V] or so, a wide viewing field cannot be obtained and the inspection takes much time. Meanwhile, by setting the acceleration voltage to 5 kV, the deflection sensitivity of about 10 [μm/V] can be maintained, and high-speed inspection as conventional can be realized.

Further, in the description above, the method for selecting the optimal combinations of the acceleration voltage, the control voltage and the deceleration voltage when the inspection with the controlled charge is carried out has been shown. However, in an inspection where voltage contrasts by the charge are not used or in the case of circuit patterns that are hardly charged, an inspection where the charge is not controlled by the control voltage is effective. In this case, the acceleration voltage is set to 10 [kV] at which the resolution of the optical system becomes highest, and an operator of the apparatus can arbitrarily determine the incident energy and the bias voltage while watching the images of a sample to be inspected (details are shown in the recipe preparation procedure described later).

Figure 9:
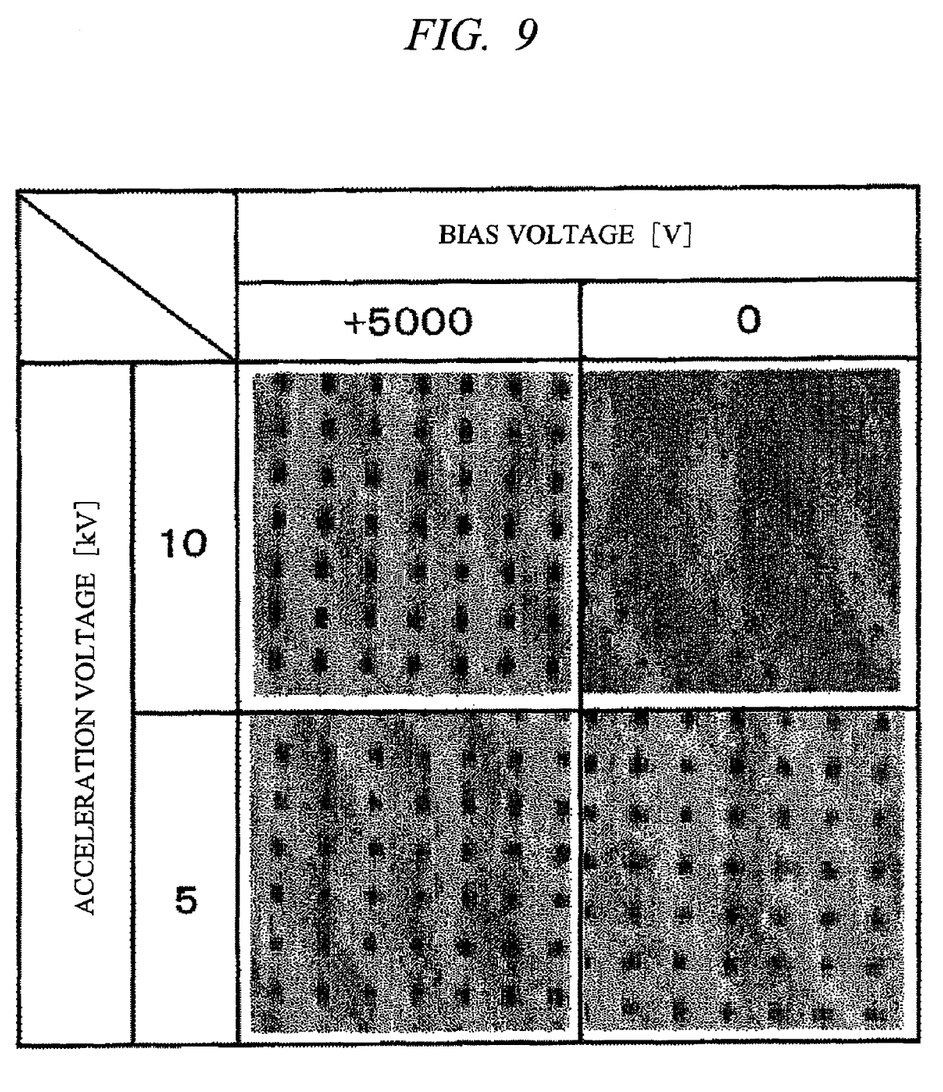
FIG. 9 is a diagram for describing the effect of the embodiment.

Next, the effect of the embodiment will be described with reference to FIG. 9. FIG. 9 shows SEM images of semiconductor patterns in the case where the acceleration voltage is 5 kV and the embodiment is used and in the case where the acceleration voltage is 10 kV and the embodiment is not used, and it also shows images in the case where the bias voltage is +5000V and the charge is not controlled and in the case where the bias voltage is 0V and the charge is controlled. As is apparent from FIG. 9, in the case of the bias voltage of +5000V, significant difference in the resolution of the images is not observed between the cases of the acceleration voltages of 10 kV and 5 kV. However, in the case of the bias voltage of 0V, the deterioration of resolution is clearly observed when the acceleration voltage is 10 kV, but when the acceleration voltage is 5 kV, the deterioration of resolution can be restrained greatly.

(Preparation of Recipe)

Figure 10:
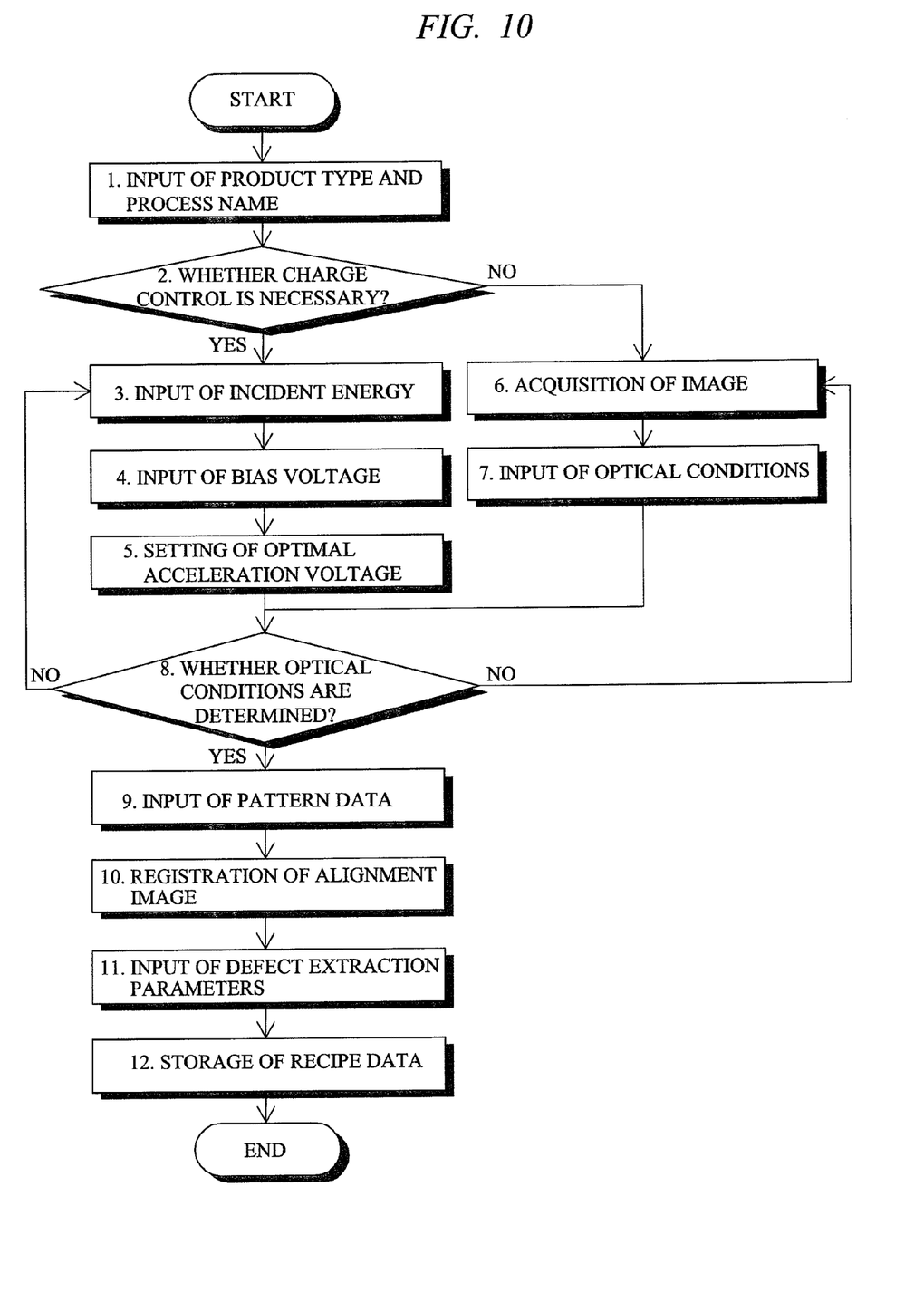
FIG. 10 is a flowchart showing the preparation procedure of recipe in the embodiment.

Next, the procedure for determining the optimal inspection conditions described above will be described. FIG. 10 shows the procedure for determining the optimal inspection conditions, and the user determines the optimal conditions on the basis of this procedure when preparing a recipe. The recipe mentioned here means data including optical conditions necessary for carrying out an inspection, information of a sample to be inspected, inspection results and others, and it is stored in a memory in the image display unit 26 in FIG. 1.

Hereinafter, according to the recipe preparation procedure, the procedure for setting the optimal optical conditions of the embodiment will be described. First, before starting the recipe preparation, in order to make a difference from other recipes, basic information of the wafer to be inspected is inputted. This corresponds to "1. Input of product type and process name" in FIG. 10, and the user inputs elements characterizing the sample to be inspected such as the type of the wafer to be inspected, process name and others. The information inputted here serves as the standard for classifying recipes later and reading recipe data from the memory. After the user inputs the basic information of the wafer, it is judged whether an inspection with the controlled charge is necessary or not (process of "2. Whether charge control is necessary?"). When the inspection with the controlled charge is necessary, the user selects the incident energy of the electron beam at "3. Input of incident energy" process, and then inputs the bias voltage corresponding to the charge of the wafer surface during the inspection at "4. Input of bias voltage". Thereafter, at "5. Setting of optimal acceleration voltage", the user sets the optimal acceleration voltage on the basis of the graph in FIG. 8 stored in the apparatus. Alternatively, in this process, the apparatus may automatically set the optimal acceleration voltage on the basis of the input values in the processes 3 and 4. Through the series of the processes described above, the optical conditions necessary for realizing the embodiment are set.

On the other hand, when the inspection with the controlled charge is not necessary, the image of the sample to be inspected is acquired and the user determines the suitable optical conditions from the contrast of the image at "6. Acquisition of image" and "7. Input of optical conditions". The setting of the above-described optical conditions can be repeated any number of times according to the instructions from the user, and the final judgment whether the optical conditions are suitable or not is made by the user of the apparatus. Then, when the user judges that the optical conditions are suitable, the user advances the process to next "9. Input of pattern data". In the process of "9. Input of pattern data", information of the wafer necessary for the inspection such as the pattern arrangement, inspection area and others of the sample to be inspected is inputted. Then, the inspection is carried out on the basis of the information including the pattern arrangement and the inspection area inputted in this process.

In the process of next "10. Registration of alignment image", an alignment image for correcting coordinates of the sample to be inspected before the inspection is registered. The alignment mentioned here means the process for correcting slight position displacement that occurs when the sample to be inspected is mounted on the sample holder. The alignment image registered in this recipe preparation is stored in the memory in the image display unit 26, and the apparatus automatically judges, from the image, the amount of position displacement of the image taken in at the alignment process from the alignment image stored in the memory and measures the slight position displacement.

"11. Input of defect extraction parameters" is the process for determining the threshold value to judge whether a specific point detected by the apparatus is a defect or not in the inspection, and the user of the apparatus can set this arbitrarily. Note that, in the method where the apparatus detects a specific point of the sample to be inspected, images of the same pattern layout in different areas in the sample to be inspected are compared to extract the specific point. Information necessary as recipe data is set through the above processes 1 to 11, and finally, "12. Storage of recipe data" is carried out and the recipe preparation is completed. The user of the apparatus prepares the recipe in accordance with the procedure described above, thereby realizing the inspection with the controlled charge according to the embodiment.

(GUI Screen)

Figure 11:
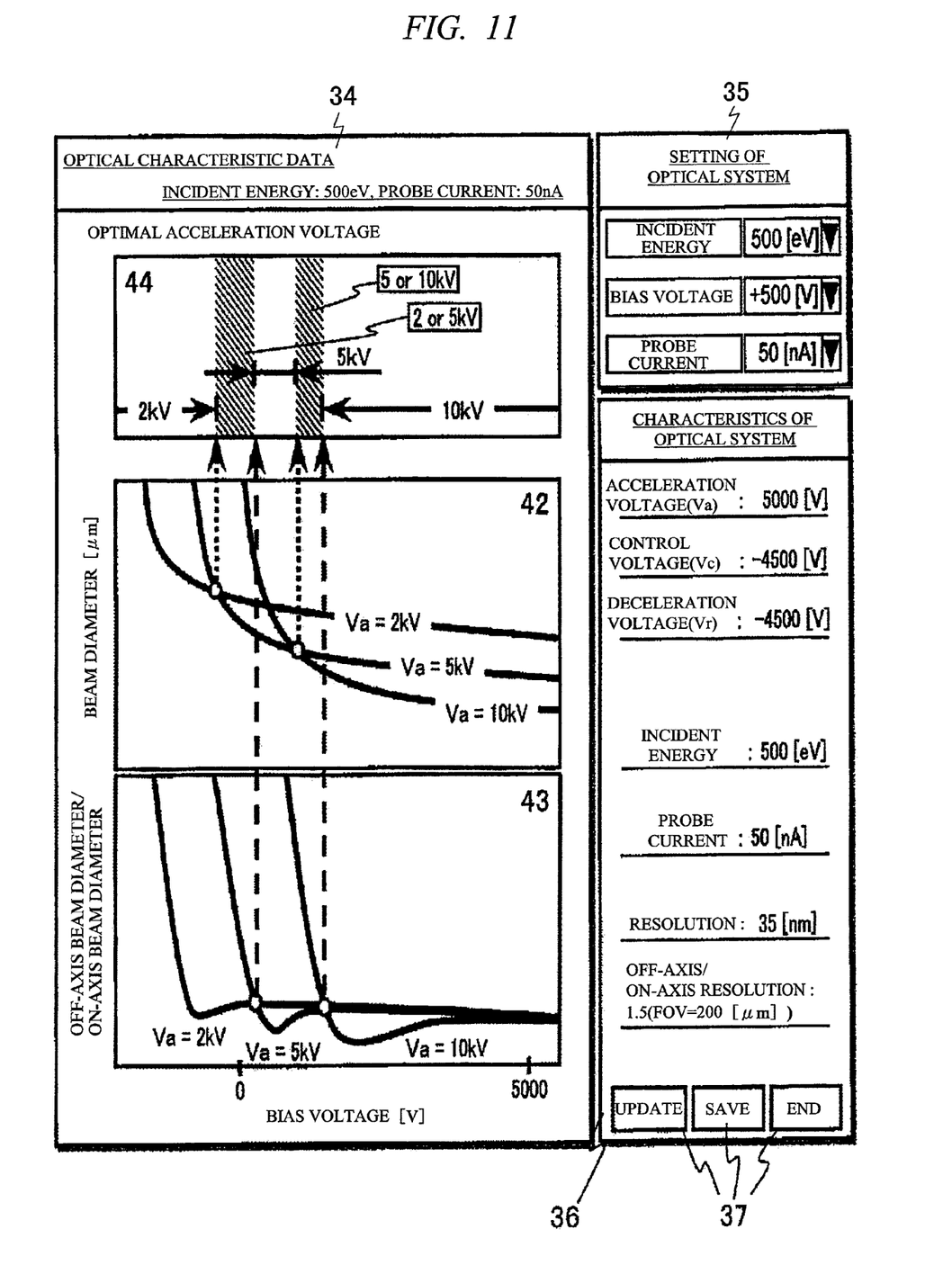
FIG. 11 is a schematic view of an example of a GUI for the recipe preparation in the embodiment.

FIG. 11 shows an example of a GUI screen in the case where the embodiment is applied to an inspection apparatus, and it is the screen to be displayed when the flow of "3. Input of incident energy", "4. Input of bias voltage", "5. Setting of optimal acceleration voltage", and "8. Determination of optical conditions" shown in FIG. 10 is carried out. The screen consists of an input screen of settings of the optical system, a display screen of optical characteristic data, and a result output screen of characteristics of the optical system. The user can input desired incident energy, bias voltage, and probe current in the input screen of settings of the optical system and can update the result by pressing an update button in the result output screen of characteristics of the optical system. Further, the user can judge whether the inputted numeric value is appropriate or not on the basis of the results on the display screen of optical characteristic data and the result output screen. If it is appropriate, the user presses a save button and presses an end button to proceed to the next recipe preparation process. On the other hand, if it is not appropriate, the user can check the result in the same procedure as described above, and this procedure is repeated until the user judges that appropriate optical conditions have been obtained. With regard to the judgment standards of the optimal optical conditions, the user designates the incident energy, the bias voltage and the probe current, and the acceleration voltage at which both the beam diameter and the off-axis beam diameter/on-axis beam diameter become minimum is employed.

However, in some bias voltages, the acceleration voltage at which the beam diameter becomes minimum does not match the acceleration voltage at which the off-axis beam diameter/on-axis beam diameter becomes minimum (for example, in the calculation result in FIG. 11, in the range of the bias voltage of 0 to 800 [V], the beam diameter is minimum at the acceleration voltage of 5 [kV] but the off-axis beam diameter/on-axis beam diameter is minimum at the acceleration voltage of 2 [kV].). In such a case, the user can arbitrarily select either of the conditions. In the case of an inspection where emphasis is placed on the resolution, the user may select the acceleration voltage at which the beam diameter becomes minimum, and in the case of an inspection where emphasis is placed on the uniformity of the viewing field more than the resolution, the user may select the acceleration voltage at which the off-axis beam diameter/on-axis beam diameter becomes minimum. Herein, the optical characteristic data to be outputted on the basis of the user input is calculated by optical characteristic simulation software of the beam diameter, the off-axis beam diameter and others incorporated in the image display unit 26 of the apparatus at every time when the user presses the update button, and the result is updated in the optical characteristic display screen and the result output screen of characteristics of the optical system. Further, this operation may be carried out by the simulation software incorporated in the image display unit 26, or manufacturers of the apparatus may store the operation in the memory of the apparatus as a matrix of data at the shipment of the apparatus.

Meanwhile, although the image display screen is not illustrated in FIG. 11, the image display screen is provided near the GUI screen illustrated in FIG. 11 in the embodiment, and when the update button mentioned above is pressed, the calculation result of optical characteristics and the image display screen are updated. The user can easily search the optimal optical conditions by use of the above-described GUI screen.

As described above, by applying the embodiment to a SEM wafer inspection apparatus, an inspection where the charge is controlled can be performed even for the resist materials and low-k materials where an inspection has been difficult due to the influence of damages.

By applying the control according to the embodiment to an inspection apparatus, an inspection where the incident energy is several 100 [eV] and the charge is controlled can be realized. Accordingly, it is possible to perform a highly sensitive inspection in semiconductor patterns that are subject to damage due to the irradiation of high-energy electron beam.

What is claimed is:

1. An inspection method in which electron beam is irradiated to a sample to be inspected and image signals obtained by detecting secondary electrons generated by the irradiation are processed, thereby performing an inspection of the sample to be inspected, wherein electrons emitted from an electron source are accelerated to an acceleration voltage, a deceleration voltage is applied to the sample to be inspected to adjust an incident energy of the electron beam, and a control voltage is applied to a control electrode disposed just above the sample, thereby forming an arbitrary field on the sample to be inspected, and the acceleration voltage, the deceleration voltage, and the control voltage are controlled in conjunction so that the energy which enters the sample, the field formed on the sample, and probe current of the electron beam which enters the sample to be inspected become almost constant.

2. The inspection method according to claim 1, wherein, while the energy which enters the sample, the field formed on the sample, and the probe current of the electron beam which enters the sample to be inspected are maintained constant, the acceleration voltage, the deceleration voltage, and the control voltage are controlled in conjunction so that a probe diameter of the electron beam becomes optimal.

3. The inspection method according to claim 1, wherein the incident energy of the electron beam is controlled to a size at which an emission efficiency of secondary electrons becomes 1 or higher and no damage occurs in the sample to be inspected.

4. The inspection method according to claim 3, wherein surface potential of the sample to be inspected is controlled by difference between the control voltage and the deceleration voltage.

5. The inspection method according to claim 1, wherein the sample is a semiconductor device, and defective shapes and electric characteristic defects of patterns formed on the semiconductor device are detected.

* * * * *